US012080583B2

(12) United States Patent
Sato et al.

(10) Patent No.: US 12,080,583 B2
(45) Date of Patent: Sep. 3, 2024

(54) BASE PLATE AND SUBSTRATE FIXING DEVICE

(71) Applicant: SHINKO ELECTRIC INDUSTRIES CO., LTD., Nagano (JP)

(72) Inventors: Ken Sato, Nagano (JP); Keiichi Takemoto, Nagano (JP); Tatsuya Nakamura, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 244 days.

(21) Appl. No.: 17/889,521

(22) Filed: Aug. 17, 2022

(65) Prior Publication Data

US 2023/0057110 A1 Feb. 23, 2023

(30) Foreign Application Priority Data

Aug. 19, 2021 (JP) .................................. 2021-133740

(51) Int. Cl.
*H01L 21/683* (2006.01)
(52) U.S. Cl.
CPC ................................ *H01L 21/6833* (2013.01)
(58) Field of Classification Search
CPC ........... H01L 21/6833; H01L 21/67103; H01L 21/67109
USPC ........................................................ 361/234
See application file for complete search history.

(56) References Cited

U.S. PATENT DOCUMENTS

| 10,199,245 | B2 * | 2/2019 | Nobori | ............. | H01L 21/67103 |
| 11,784,079 | B2 * | 10/2023 | Hidaka | ................ | C04B 35/645 |
| | | | | | 361/234 |
| 2008/0178608 | A1 * | 7/2008 | Tandou | .................. | F25B 39/02 |
| | | | | | 62/515 |
| 2011/0154843 | A1 * | 6/2011 | Ko | ...................... | H01L 21/6831 |
| | | | | | 62/259.2 |
| 2011/0207243 | A1 | 8/2011 | Tandou et al. | | |
| 2015/0036261 | A1 * | 2/2015 | Jindo | ................ | C04B 35/62635 |
| | | | | | 165/185 |
| 2015/0077895 | A1 * | 3/2015 | Jindo | .................... | C04B 35/645 |
| | | | | | 228/121 |
| 2015/0243486 | A1 * | 8/2015 | Yokogawa | ........ | H01J 37/32697 |
| | | | | | 156/345.28 |
| 2016/0042923 | A1 * | 2/2016 | Suh | ................... | H01J 37/32724 |
| | | | | | 118/723 R |

FOREIGN PATENT DOCUMENTS

| JP | 2006-041025 | | 2/2006 | | |
| JP | 2008-186856 | | 8/2008 | | |
| JP | 2014195047 | A * | 10/2014 | ....... | H01L 21/67109 |
| JP | 2015-220385 | | 12/2015 | | |
| TW | 201444020 | A * | 11/2014 | ....... | H01L 21/67109 |

* cited by examiner

*Primary Examiner* — Dharti H Patel
(74) *Attorney, Agent, or Firm* — Rankin, Hill & Clark LLP

(57) ABSTRACT

A base plate has one surface and the other surface opposite to the one surface. An electrostatic chuck is capable of being mounted on the one surface. The base plate includes a refrigerant flow path provided therein. An inner wall of the refrigerant flow path has an upper surface convex toward the one surface in a longitudinal sectional view in a direction intersecting with a direction in which refrigerant flows. An unevenness is formed on the upper surface.

10 Claims, 4 Drawing Sheets

BASE PLATE AND SUBSTRATE FIXING DEVICE

CROSS-REFERENCE TO RELATED APPLICATIONS

This application is based on and claims the benefit of priority from prior Japanese patent application No. 2021-133740 filed on Aug. 19, 2021, the entire contents of which are incorporated herein by reference.

TECHNICAL FIELD

The present invention relates to a base plate and a substrate fixing device.

BACKGROUND ART

In the related art, a film formation apparatus (for example, a CVD apparatus, a PVD apparatus, and the like) and a plasma etching apparatus that are used when manufacturing a semiconductor device such as an IC and an LSI have a stage for accurately holding a wafer in a vacuum treatment chamber.

As such a stage, for example, suggested is a substrate fixing device configured to suck and hold a wafer, which is a suction target object, by an electrostatic chuck mounted on a base plate. The base plate is provided therein with a refrigerant flow path for cooling the wafer, for example. For example, in order to improve the cooling efficiency for the wafer, it has been suggested to provide an unevenness on a side surface of the refrigerant flow path (for example, refer to PTL 1).

CITATION LIST

Patent Literature

PTL 1: JP-A-2008-186856

SUMMARY OF INVENTION

However, as for the base plate, it is required to further improve the cooling efficiency on a side on which the electrostatic chuck is mounted.

Aspect of non-limiting embodiments of the present disclosure is to provide a base plate capable of improving the cooling efficiency on a side on which an electrostatic chuck is mounted.

According to an aspect of the present disclosure, there is provided a base plate having one surface and the other surface opposite to the one surface. An electrostatic chuck is capable of being mounted on the one surface. The base plate comprises a refrigerant flow path provided therein. An inner wall of the refrigerant flow path has an upper surface convex toward the one surface in a longitudinal sectional view in a direction intersecting with a direction in which refrigerant flows. An unevenness is formed on the upper surface.

According to the disclosed technology, it is possible to provide the base plate capable of improving the cooling efficiency on the side on which the electrostatic chuck is mounted.

DESCRIPTION OF EMBODIMENTS

Hereinafter, embodiments of the present invention will be described with reference to the drawings. Note that, in the respective drawings, the parts having the same configurations are denoted with the same reference signs, and the overlapping descriptions may be omitted.

[Overall Structure of Substrate Fixing Device 1]

Figure 1:
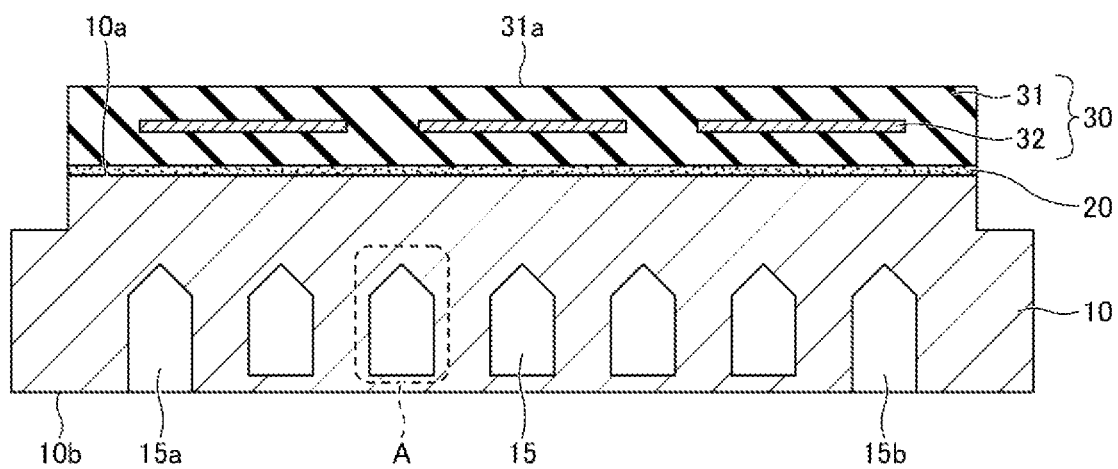
FIG. 1 is a sectional view simplifying and exemplifying a substrate fixing device according to the present embodiment.

FIG. 1 is a sectional view simplifying and exemplifying a substrate fixing device according to the present embodiment. Referring to FIG. 1, a substrate fixing device 1 has, main constitutional elements, a base plate 10, an adhesive layer 20, and an electrostatic chuck 30.

The base plate 10 has one surface 10a and the other surface 10b opposite to the one surface 10a, and the electrostatic chuck 30 can be mounted on the one surface 10a-side. The one surface 10a and the other surface 10b of the base plate 10 are substantially parallel.

A thickness of the base plate 10 is, for example, about 20 to 40 mm. The base plate 10 is formed of, for example, aluminum or titanium, and can be used as an electrode or the like for controlling plasma. By supplying predetermined high-frequency electric power to the base plate 10, the energy for causing ions and the like in a generated plasma state to collide with a wafer sucked on the electrostatic chuck 30 can be controller to effectively perform etching processing.

The base plate 10 has therein a refrigerant flow path 15. The refrigerant flow path 15 has a refrigerant introduction portion 15a at one end and a refrigerant discharge portion 15b at the other end. The refrigerant flow path 15 can be connected to a refrigerant control device (not shown) provided outside the substrate fixing device 1. The refrigerant control device (not shown) can introduce refrigerant (for example, cooling water, GALDEN and the like) from the refrigerant introduction portion 15a into the refrigerant flow path 15 and to discharge the refrigerant from the refrigerant discharge portion 15b. By circulating the refrigerant in the refrigerant flow path 15 to cool the base plate 10, it is possible to cool the wafer sucked on the electrostatic chuck 30.

A gas supply part configured to supply a gas for cooling the wafer sucked and held by the electrostatic chuck 30 may be provided inside the base plate 10. The gas supply part is, for example, a hole formed in the base plate 10. By introducing, for example, an inert gas (for example, He, Ar, etc.) from an outside of the substrate fixing device 1 into the gas supply part, the wafer sucked and held by the electrostatic chuck 30 can be cooled.

The electrostatic chuck 30 is a part configured to suck and hold a wafer that is a suction target object. A planar shape of the electrostatic chuck 30 is circular, for example. A diameter of the wafer that is a suction target object of the electrostatic chuck 30, is, for example, 8 inches, 12 inches or 18 inches. Note that, the description 'as seen from above' indicates that a target object is seen from a normal direction of a placement surface 31a of a base body 31, and the description 'planar shape' indicates a shape of the target object as seen from the normal direction of the placement surface 31a of the base body 31.

The electrostatic chuck 30 is mounted on one surface 10a of the base plate 10 via the adhesive layer 20. The adhesive layer 20 is, for example, a silicone-based adhesive. A thickness of the adhesive layer 20 is, for example, about 0.1 to 1.0 mm. The adhesive layer 20 has effects of bonding the base plate 10 and the electrostatic chuck 30 and reducing stress that is generated due to a difference in thermal expansion coefficient between the electrostatic chuck 30 made of ceramics and the base plate 10 made of aluminum or titanium.

The electrostatic chuck 30 has a base body 31 and an electrostatic electrode 32. An upper surface of the base body 31 is a placement surface 31a on which a suction target object is placed. The electrostatic chuck 30 is, for example, a Johnsen-Rahbeck type electrostatic chuck. However, the electrostatic chuck 30 may also be a Coulomb force type electrostatic chuck.

The base body 31 is a dielectric body. As the base body 31, for example, ceramics such as aluminum oxide ($Al_2O_3$) and aluminum nitride (AlN) are used. The base body 31 may include, as auxiliary agents, oxides of two or more elements selected from silicon (Si), magnesium (Mg), calcium (Ca), aluminum (Al) and yttrium (Y). A thickness of the base body 31 is, for example, about 5 to 10 mm, and a relative permittivity (kHz) of the base body 31 is, for example, about 9 to 10.

The electrostatic electrode 32 is a thin film electrode, and is embedded in the base body 31. The electrostatic electrode 32 is connected to a power supply provided outside the substrate fixing device 1, and generates a suction force between the electrostatic electrode and the wafer by static electricity when a predetermined voltage is applied from the power supply. Thereby, it is possible to suck and hold the wafer on the placement surface 31a of the base body 31 of the electrostatic chuck 30. The higher the voltage applied to the electrostatic electrode 32 is, the stronger the suction holding force is. The electrostatic electrode 32 may have a unipolar shape or a bipolar shape. As a material of the electrostatic electrode 32, tungsten, molybdenum or the like is used, for example.

The base body 31 may be provided therein with a heat generating body configured to generate heat by applying a voltage from an outside of the substrate fixing device 1 and to heat so that the placement surface 31a of the base body 31 becomes a predetermined temperature.

[Shape of Inner Wall of Refrigerant Flow Path 15]

Figure 2A:
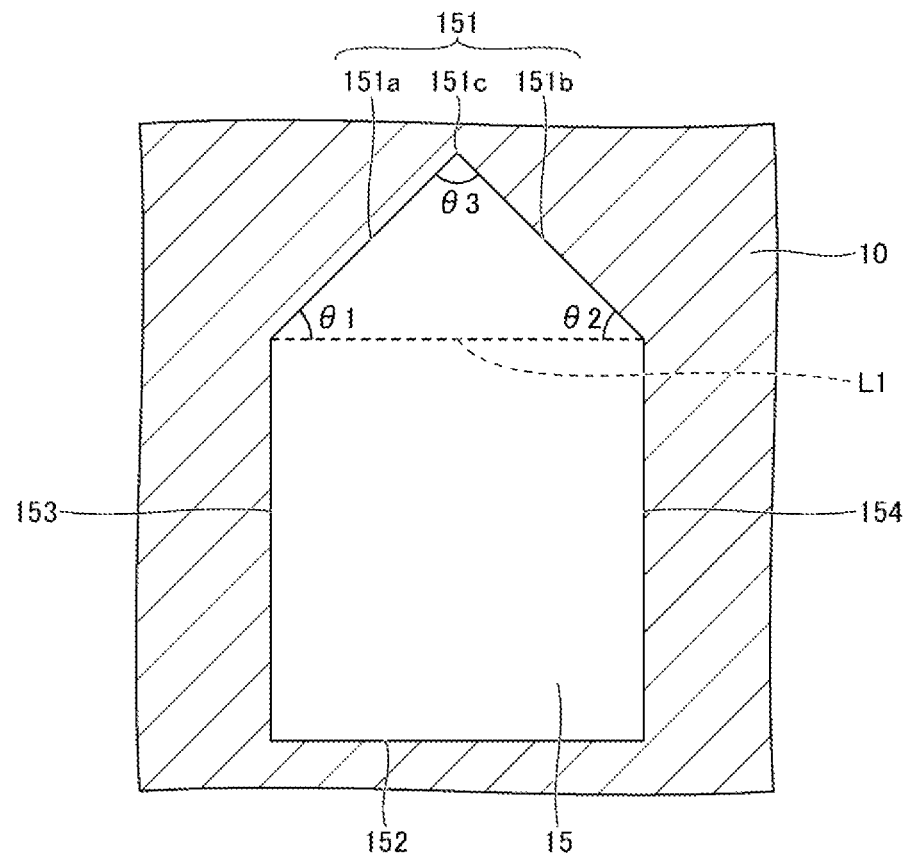
FIGS. 2A and 2B are partially enlarged views of a vicinity of a refrigerant flow path in FIG. 1.
Figure 2B:
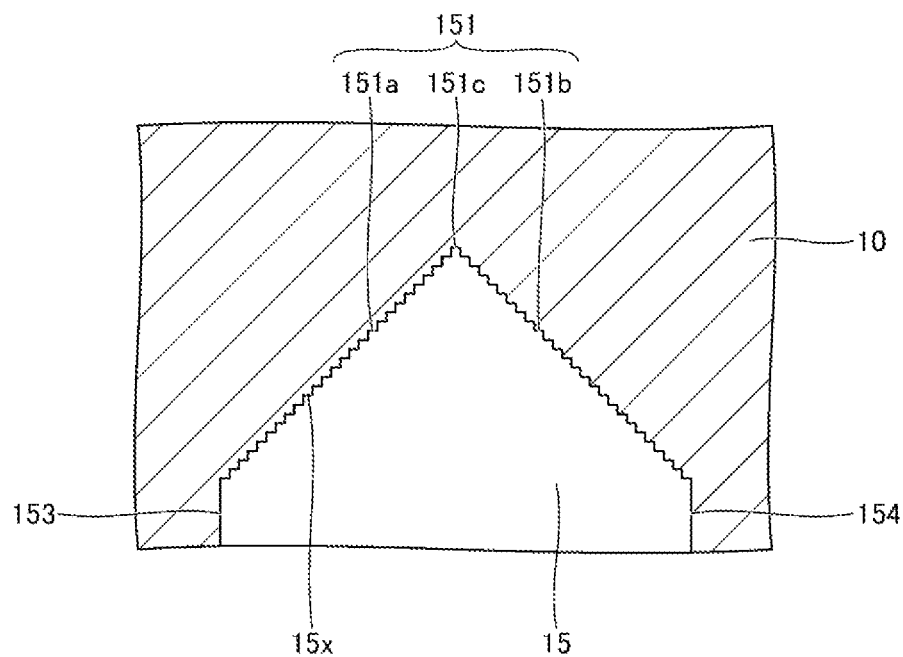

FIGS. 2A and 2B are partially enlarged views of a vicinity of the refrigerant flow path, in which FIG. 2A is an enlarged view of an A part of FIG. 1 and FIG. 2B is an enlarged view of a vicinity of an upper surface of FIG. 2A.

Referring to FIGS. 1 and 2A, 2B, an inner wall of the refrigerant flow path 15 has, for example, a pentagonal shape in a longitudinal sectional view in a direction intersecting with a direction in which the refrigerant flows. Each corner of the inner wall of the refrigerant flow path 15 may have an R-shape, a chamfered shape, or the like. Note that, the longitudinal sectional view in the direction intersecting with the direction in which the refrigerant flows is, for example, a longitudinal sectional view in a direction orthogonal to the direction in which the refrigerant flows, as shown in FIGS. 1 and 2A, 2B.

In the longitudinal sectional view shown in FIGS. 1 and 2A, 2B, the inner wall of the refrigerant flow path 15 has an upper surface 151 convex toward one surface 10a-side of the base plate 10, a bottom surface 152 positioned closer to the other surface 10b-side than the upper surface 151, and a pair of side surfaces 153 and 154 connecting both ends of the upper surface 151 and both ends of the bottom surface 152. A width of the refrigerant flow path 15, i.e., an interval between the side surface 153 and the side surface 154 facing each other is, for example, about 1 mm to 3 mm. A maximum height of the refrigerant flow path 15 is, for example, about 2 to 3 times of the width of the refrigerant flow path 15.

The upper surface 151 has a first inclined surface 151a that is continuous with an end portion of one side surface 153 and is inclined so as to approach the one surface 10a-side of the base plate 10 and the other side surface 154-side. In addition, the upper surface 151 has a second inclined surface 151b that is continuous with an end portion of the other side surface 154 and is inclined so as to approach one surface 10a-side of the base plate 10 and the one side surface 153-side.

The second inclined surface 151b intersects with the first inclined surface 151a to form a corner 151c. The corner 151c may be paraphrased as an apex in a cross sectional view. A tip end portion of the upper surface 151 including an intersection of the first inclined surface 151a and the second inclined surface 151b is, for example, sharp. However, the tip end portion of the upper surface 151 including the intersection of the first inclined surface 151a and the second inclined surface 151b does not have to be sharp, like the corner 151c, and may have an R-shape or a chamfered shape in a cross sectional view. In other words, in a cross sectional view, the refrigerant flow path 15 may not be formed with a clear apex.

As shown in FIG. 2B, the upper surface 151 is formed with an unevenness 15x. On the upper surface 151, a height of the unevenness 15x is, for example, 0.05 mm or more and 0.1 mm or less. Here, the height of the unevenness 15x is assumed to correspond to Rz specified in JIS B 0601 2013. Note that, JIS B 0601 2013 defines roughness parameters, and corresponds to ISO 4287 1997/Ammendment1 2009. Rz is maximum peak to valley height which is the vertical distance between the highest peak and lowest peak of the roughness profile within the specified distance.

The base plate 10 is preferably manufactured by a 3D metal printer. Conventionally, a refrigerant flow path is provided in a metal serving as a base plate by cutting a metal bulk by machining and bonding the cut metals each other by soldering or the like. However, with this method, it is difficult to form the unevenness 15x on the convex upper surface 151 of the refrigerant flow path 15 having a shape as shown in FIG. 2B. By manufacturing the base plate 10 with the 3D metal printer, as shown in FIG. 2B, it is possible to easily form the refrigerant flow path 15 in which the unevenness 15x is formed on the convex upper surface 151. Note that, the base plate 10 manufactured by the 3D metal printer is an integrally molded product, and is different from a conventional base plate, in that it does not have an interface inside.

In the base plate 10, an unevenness is not formed on the bottom surface 152 and the side surfaces 153 and 154, but an unevenness may be formed due to manufacturing accuracy. Even in this case, a height of the unevenness formed on the bottom surface 152 and the side surfaces 153 and 154 is generally lower than the height of the unevenness formed on the upper surface 151. On the bottom surface 152 and the side surfaces 153 and 154, the height of the unevenness is, for example, 0.04 mm or less. In particular, since an unevenness is difficult to be formed on the bottom surface 152, the height of the unevenness formed on the bottom surface 152 is generally lower than the height of the unevenness formed on the side surfaces 153 and 154. In other words, a roughness of the upper surface 151 is greater than a roughness of the bottom surface 152 and a roughness of the side surfaces 153 and 154. Further, the roughness of the side surfaces 153 and 154 is greater than a roughness of the bottom surface 152. Here, the magnitude of the roughness of each surface is assumed to be compared by Ra specified in JIS B 0601 2013. Ra is arithmetical mean roughness value which is the arithmetic mean from all values of the roughness profile within the specified distance. Note that, the bottom surface 152 and the side surfaces 153 and 154 may also be flat surfaces having no unevenness.

When a virtual line segment L1 connecting an end portion of one side surface 153 and an end portion of the other side surface 154 each other is defined, as shown in FIG. 2A, a figure defined by the first inclined surface 151a, the second inclined surface 151b and the virtual line segment L1 has three internal angles. An angle of a first internal angle θ1 formed by the virtual line segment L1 and the first inclined surface 151a is preferably 20 degrees or more and 50 degrees or less, and more preferably 25 degrees or more and 45 degrees or less. In addition, an angle of a second internal angle θ2 formed by the virtual line segment L1 and the second inclined surface 151b is preferably 20 degrees or more and 50 degrees or less, and more preferably 25 degrees or more and 45 degrees or less. By setting the first internal angle θ1 and the second internal angle θ2 to such angles, it becomes easy to manufacture the base plate 10 by the 3D metal printer. An absolute value of a difference between the angle of the first internal angle θ1 and the angle of the second internal angle θ2 is, for example, 0 degree or more and 10 degrees or less. In addition, a third internal angle θ3 formed by the first inclined surface 151a and the second inclined surface 151b is, for example, an obtuse angle. By setting such angles, it becomes easy to manufacture the base plate 10 by the 3D metal printer.

Note that, since the first inclined surface 151a and the second inclined surface 151b have the unevenness 15x, the shapes of the first inclined surface 151a and the second inclined surface 151b are assumed as being indicated by average lines used for calculation of Ra specified in JIS B 0601 2013. For example, the average lines are used when calculating the angle of each internal angle. In addition, when the average line is a curved line, it is assumed that tangential lines at both ends of the virtual line segment L1 are used.

The first inclined surface 151a and the second inclined surface 151b may be each a flat surface or a curved surface. That is, when the first inclined surface 151a and the second inclined surface 151b are indicated by the average lines used for calculation of Ra specified in JIS B 0601 2013, the average lines may be each a straight line or a curved line in a cross sectional view. When the first inclined surface 151a and the second inclined surface 151b are close to flat surfaces, it becomes easier to manufacture the base plate 10 by the 3D metal printer. When the first inclined surface 151a and the second inclined surface 151b are planar surfaces, the figure defined by the first inclined surface 151a, the second inclined surface 151b, and the virtual line segment L1 is, for example, an isosceles triangle.

As described above, in the base plate 10 of the substrate fixing device 1, the upper surface 151, which is the surface closest to the wafer to be cooled, has a convex shape toward one surface 10a of the base plate 10 and the unevenness 15x is provided on the upper surface 151, in the inner wall of the refrigerant flow path 15. Thereby, it is possible to increase a contact area between the inner wall of the refrigerant flow path 15 and the refrigerant on a side closest to the wafer to be cooled, so that it is possible to improve the cooling efficiency for the wafer. In addition, the first inclined surface 151a and the second inclined surface 151b are inclined by predetermined angles, so that it becomes easier to manufacture the base plate 10 by the 3D metal printer.

Although the preferred embodiment and the like have been described in detail, the present invention is not limited to the above-described embodiment and the like, and a variety of changes and replacements can be made for the above-described embodiment and the like without departing from the scope defined in the claims.

For example, as the suction target object of the substrate fixing device of the present invention, a glass substrate and the like that are used in a manufacturing process of a liquid crystal panel and the like may be exemplified, in addition to the semiconductor wafer (silicon wafer, and the like).

Figure 3:
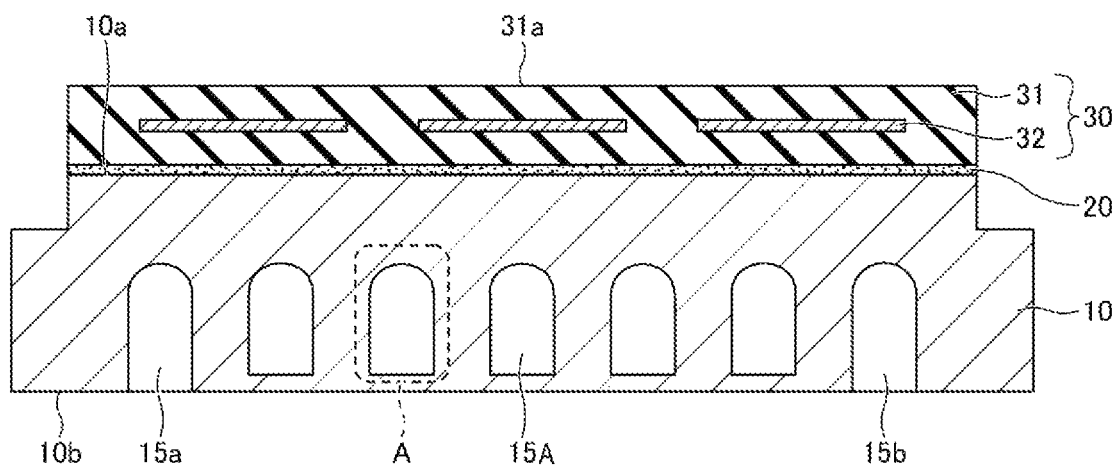
FIG. 3 is a sectional view simplifying and exemplifying a substrate fixing device according to a modified example of the present embodiment.
Figure 4A:
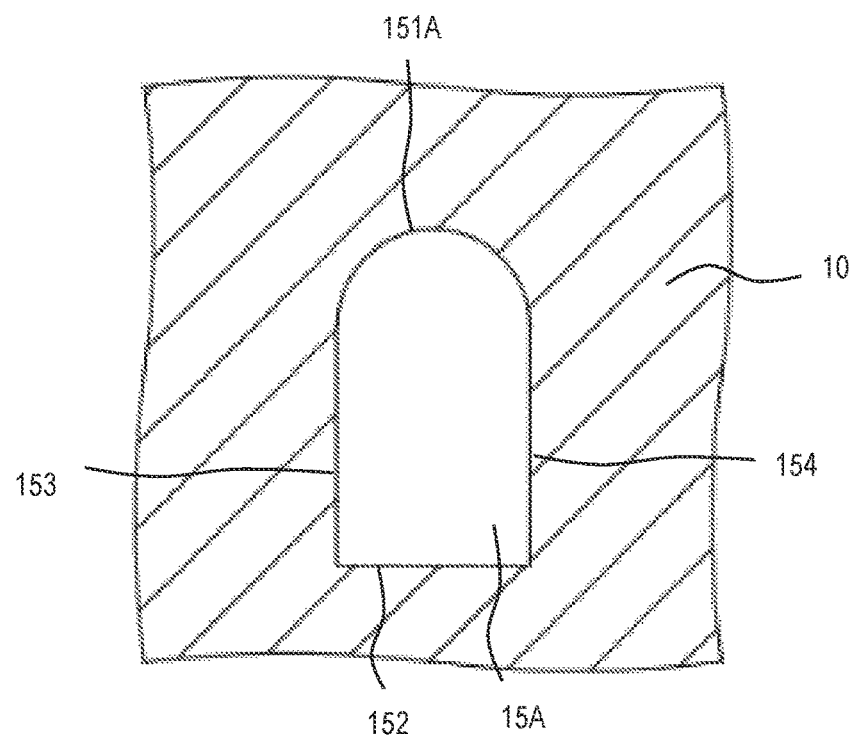
FIGS. 4A and 4B are partially enlarged views of a vicinity of a refrigerant flow path in FIG. 3.
Figure 4B:
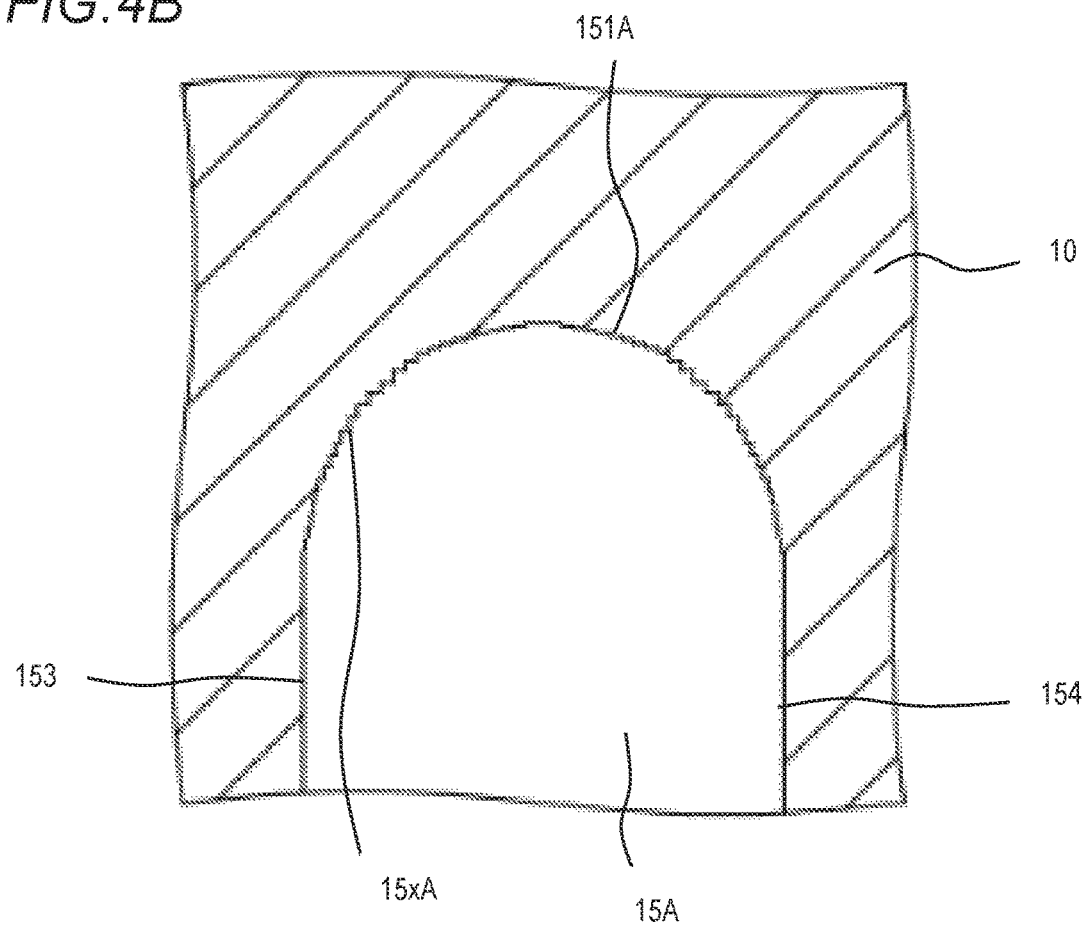

For example, as shown in FIGS. 3 and 4A, 4B, the inner wall of a refrigerant flow path 15A may have a curved upper surface 151A convex toward one surface 10a-side of the base plate 10. As shown in FIG. 4B, the upper surface 151A is formed with an unevenness 15xA. On the upper surface 151A, a height of the unevenness 15xA is, for example, 0.05 mm or more and 0.1 mm or less.

What is claimed is:

1. A base plate having one surface and the other surface opposite to the one surface, an electrostatic chuck being capable of being mounted on the one surface, the base plate comprising:
    a refrigerant flow path provided therein,
    wherein an inner wall of the refrigerant flow path has an upper surface convex toward the one surface in a longitudinal sectional view in a direction intersecting with a direction in which refrigerant flows, and
    wherein an unevenness is formed on the upper surface.

2. The base plate according to claim 1, wherein, in the longitudinal sectional view, the inner wall of the refrigerant flow path has
    a bottom surface positioned closer to the other surface than the upper surface, and
    a first side surface and a second side surface connecting both ends of the upper surface and both ends of the bottom surface each other, and
    wherein a roughness of the upper surface is greater than a roughness of the bottom surface and a roughness of the first and second side surfaces.

3. The base plate according to claim 2, wherein the roughness of the first and second side surfaces is greater than the roughness of the bottom surface.

4. The base plate according to claim 2, wherein, in the longitudinal sectional view, the upper surface has
    a first inclined surface that is continuous with an end portion of the first side surface and is inclined so as to approach the one surface and the second side surface, and
    a second inclined surface that is continuous with an end portion of the second side surface, is inclined so as to approach the one surface and the first side surface and is continuous with the first inclined surface,
    wherein when a virtual line segment connecting an end portion of the first side surface and an end portion of the second side surface each other is defined, a figure defined by the first inclined surface, the second inclined surface and the virtual line segment has three internal angles including a first internal angle formed by the virtual line segment and the first inclined surface, a second internal angle formed by the virtual line segment and the second inclined surface, and a third internal angle formed by the first inclined surface and the second inclined surface, wherein an angle of the first internal angle is 20 degrees or more and 50 degrees or less, and wherein an angle of the second internal angle is 20 degrees or more and 50 degrees or less.

5. The base plate according to claim 4, wherein, in the longitudinal sectional view, an absolute value of a difference between the angle of the first internal angle and the angle of the second internal angle is 0 degree or more and 10 degrees or less.

6. The base plate according to claim 4, wherein, in the longitudinal sectional view, the third internal angle is an obtuse angle.

7. The base plate according to claim 4, wherein the first inclined surface and the second inclined surface are flat surfaces.

8. The base plate according to claim 4, wherein, in the longitudinal sectional view, a tip end portion of the upper surface comprising an intersection of the first inclined surface and the second inclined surface is sharp.

9. The base plate according to claim 1, wherein the base plate is an integrally molded product and does not have an interface inside.

10. A substrate fixing device comprising:
the base plate according to claim 1; and
an electrostatic chuck mounted on the one surface of the base plate.

* * * * *